United States Patent [19]

Curran et al.

[11] Patent Number: 5,401,914
[45] Date of Patent: Mar. 28, 1995

[54] VENT FOR SHIELDED ENCLOSURES

[75] Inventors: William E. Curran, Medinah; Joseph C. Weibler, West Chicago; Michael T. Egan, Glen Ellyn, all of Ill.

[73] Assignee: The Curran Company, Glendale Heights, Ill.

[21] Appl. No.: 12,902

[22] Filed: Feb. 3, 1993

[51] Int. Cl.6 ............................................. H05K 9/00
[52] U.S. Cl. ................................. 174/356; 55/307; 55/330; 454/367
[58] Field of Search .............. 174/35 MS, 35 R, 35 L; 52/2.11; 55/307, 308, 321, 330; 138/111, 115; 210/459, 460, 462; 454/367

[56] References Cited

U.S. PATENT DOCUMENTS

| | | | |
|---|---|---|---|
| 926,704 | 6/1909 | Levy | 210/463 |
| 1,166,005 | 12/1915 | Robinett et al. | 454/367 |
| 3,229,429 | 1/1966 | Conrad | 52/2.11 |
| 3,537,485 | 11/1970 | March | 138/115 |
| 3,546,359 | 12/1970 | Ciccarelli | 174/35 MS |
| 3,553,343 | 1/1971 | Garlington | 174/35 MS |
| 3,580,981 | 5/1971 | Lamp et al. | 174/35 MS |
| 3,584,134 | 6/1971 | Nichols et al. | 174/35 MS |
| 3,627,678 | 12/1971 | Marston et al. | 210/695 |
| 3,638,402 | 2/1972 | Thomas | 55/307 |
| 4,091,230 | 5/1978 | Rubinowitz et al. | 174/15 C |
| 4,442,643 | 4/1984 | Stadtheim | 52/219 |
| 4,464,540 | 8/1984 | Reeder | 174/35 C |
| 4,478,915 | 10/1984 | Ross et al. | 428/607 |
| 4,489,217 | 12/1984 | Klopfer | 174/35 C |
| 4,533,795 | 8/1985 | Baumhauer, Jr. et al. | 381/159 |
| 4,549,475 | 10/1985 | Snyder | 220/372 X |
| 4,604,202 | 8/1986 | Movshovitz | 210/409 |
| 4,616,101 | 10/1986 | Veerman et al. | 174/35 MS |
| 4,678,716 | 7/1987 | Tzeng | 428/551 |
| 4,883,590 | 11/1989 | Papp | 210/164 |
| 4,959,504 | 9/1990 | Yarger et al. | 174/35 MS |
| 5,025,489 | 6/1991 | Yamaguchi | 174/35 RX |
| 5,032,689 | 7/1991 | Halligan et al. | 174/35 R |
| 5,061,685 | 10/1991 | Kosuge et al. | 505/213 |
| 5,268,530 | 12/1993 | Shimizu et al. | 505/213 |
| 5,289,347 | 2/1994 | McCarthy et al. | 361/809 |

*Primary Examiner*—Leo P. Picard
*Assistant Examiner*—Christopher Horgan
*Attorney, Agent, or Firm*—Mason, Kolehmainen, Rathburn & Wyss

[57] ABSTRACT

A shielding vent for an electromagnetic interference shielded enclosure having an electrically conducting wall shield includes a mounting plate or flange through which extends a vent pipe with an internal septum plate or divider extending axially along at least a portion of the inner length of the vent pipe. The mounting flange is secured to a wall of the shielded enclosure over an opening in the wall and to the wall shield to insure that the integrity of the shielding for the enclosure is maintained. With the mounting flange so mounted on the wall of the enclosure, the vent pipe extends through the opening in the wall of the enclosure and provides fluid communication between an internal region of the enclosure and a region external of the enclosure. The septum plate has a cross section in the shape of a cross so that at least a portion of the length of the cylindrically shaped vent pipe is subdivided into four parallel, axially extending equal fluid flow sections. These fluid flow sections are sufficiently large in cross sectional area that they provide a minimum of resistance to fluid flowing through the vent pipe. By using the cross-shaped septum plate in the vent pipe, the vent pipe can be made significantly shorter in length than previously used vent pipes of similar diameter, yet the vent affords an adequate degree of EMI shielding.

24 Claims, 1 Drawing Sheet

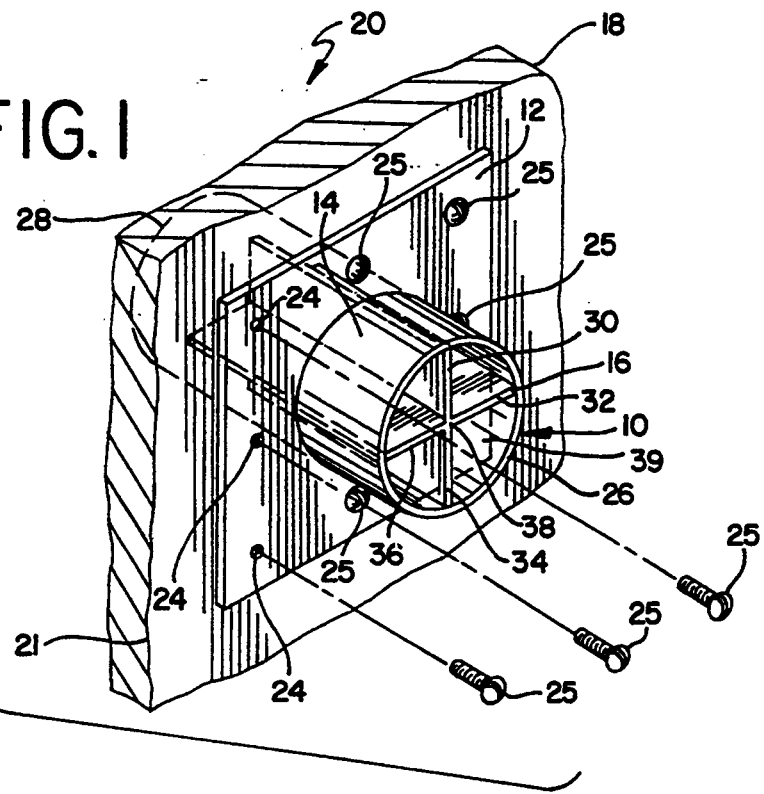
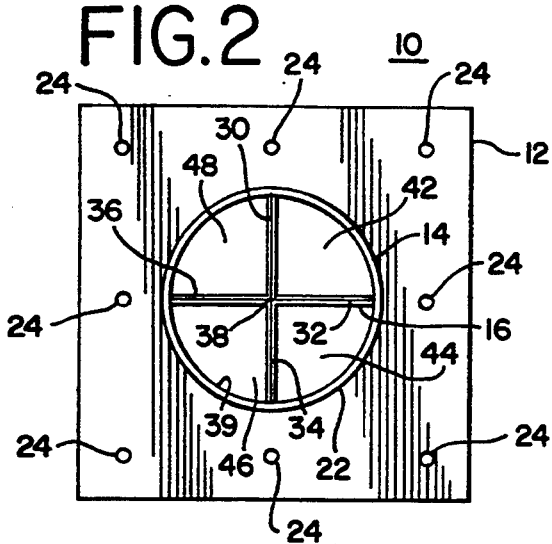
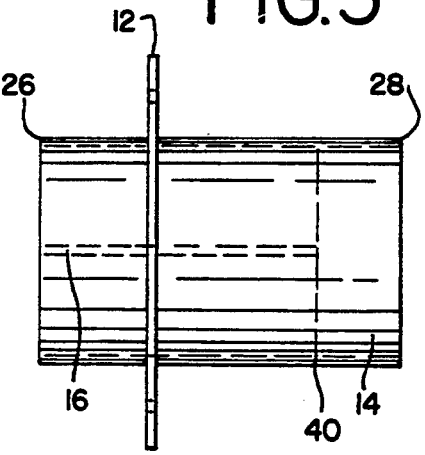
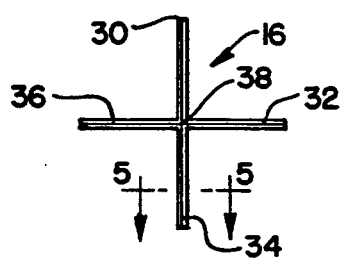
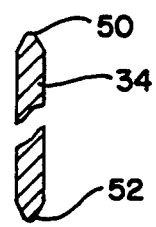

VENT FOR SHIELDED ENCLOSURES

BACKGROUND OF THE INVENTION

1. Field of the Invention

The present invention relates generally to electromagnetic interference (EMI) shielding, and, more particularly, to a new and improved shielding vent for a shielded enclosure.

2. Description of the Prior Art

Diagnostic equipment, such as magnetic resonance imaging equipment, are typically used within a shielded enclosure. The shielded enclosure is used to inhibit electromagnetic radiation, such as radio frequency radiation and the like, from interfering with the operation of the equipment in the enclosure. Such enclosures may be a room or some similar structure that is located within a parent or larger room or structure. The shielded enclosure may include a single shield or multiple shields of electrically conductive metal and/or metal mesh or screen that provides the necessary shielding of the space within the enclosure. In certain instances, the shield is in the form of a conductive metal skin or layer, such as a thin sheet or foil of copper, that is disposed on the outer walls of the enclosure.

The shielded enclosure and in certain instances, equipment located in the enclosure, need to be provided with adequate venting. The vents that are used for this purpose must still provide electromagnetic interference (EMI) shielding so that even though fluid may be allowed to flow through the vent, the vent nevertheless still will sufficiently attenuate any electromagnetic radiation that might adversely affect the equipment being used in the enclosure. This attenuation needs to be effective with respect to any waves that have a frequency below a given cutoff frequency. In order to provide this necessary electric field shielding, vents for such shielded enclosures have used honeycomb structures or panels disposed within the vent.

U.S. Pat. Nos. 3,546,359 (Ciccarelli), 3,553,343 (Garlington), 3,580,981 (Lamp et al.), 3,584,134 (Nichols et al.) disclose shielded vents that can be used as vents or ventilating units for shielded or protected enclosures. In each of these patents, the structure that is used to provide the vent with RFI or EMI protection is a honeycomb panel or structure. For example, back-to-back honeycomb panels 26 and 28 are used in a vent 10 disclosed in the Ciccarelli '359 patent. The panels 26 and 28 are inclined upwardly and inwardly toward the junction between the panels. In the Garlington '343 patent, a honeycomb grill 15 (shown particularly in FIG. 1 of that patent) is disposed in an air duct housing 12 having a right angle bend. The Lamp et al. '981 patent also discloses the use of a honeycomb 12 in a ventilating panel 10 to provide EMI shielding. Similarly, the Nichols et al. '134 patent discloses the use of honeycomb elements 15a and 15b to provide shielding in a vent for a shielded room. While each of these patents disclose structures for shielded vents, the disclosed vents utilize a honeycomb structure or panel to provide the necessary EMI shielding.

In the case of shielded enclosures or rooms designed for diagnostic equipment, such as magnetic resonance medical equipment, the vents used in these enclosures must not only provide the necessary EMI shielding, but also must be capable of venting or relieving a large amount of air in a short period of time. This is because such diagnostic equipment typically uses a superconducting, supercooled electromagnet. The magnet is cooled in a cryogenic system using liquid gas, such as liquid nitrogen or liquid helium, maintained at a temperature near absolute zero. Under certain circumstances, the liquid gas may be quenched to room temperature. In such instances, the liquid gas is rapidly warmed to room temperature in a matter of a few seconds. This rapid warming of the liquid gas results in a rapid increase in the volume of the gas within the cryogenic system which must be vented to the outside of the enclosure. Unless the gas is so vented, the electromagnet used in the diagnostic equipment can be damaged.

The use of superconducting, supercooled electromagnets in such diagnostic equipment necessitates the use of a vent that is capable of venting significant volumes of air within a short period of time when the electromagnets are quenched from a relatively cold temperature to room temperature. Unfortunately, honeycomb structures, such as the ones used in the vents disclosed in the above discussed patents, present small cross sectional flow areas that tend to freeze up and inhibit the ability of the vent to relieve large volumes of air from within such shielded rooms in a short period of time.

In order to provide the necessary cross section fluid flow areas that are needed to vent a sudden increase in air pressure that might develop in such systems, vent pipes having a substantial diameter and no honeycomb structures have been used. However, these types of pipes need to be of a substantial length in order to provide effective EMI shielding. In fact, the length of the pipe may need to be as much as four times greater than the diameter of the pipe in order for such a vent to provide a desirable amount of EMI shielding. For example, a vent pipe having an eight inch diameter is used with some shielded enclosures. Such a pipe would have to be as much as thirty two inches in length to provide a desired amount of EMI shielding. However, a vent pipe having such a substantial length tends to present physical problems in that it may interfere with other equipment, ducts or lines that are used in or around the enclosure.

SUMMARY OF THE INVENTION

Accordingly, objects of the present invention are to provide a new and improved vent for shielded enclosures; to provide a new and improved vent for shielded enclosures that provides adequate EMI shielding yet still provides a sufficient cross section flow area to adequately vent exhausts from cryogenic systems used in magnetic resonance imaging equipment; and to provide a new and improved vent for shielded enclosures that has a substantial cross section flow area and adequate EMI shielding, but nevertheless is not so long as to present installation problems with respect to a shielded enclosure.

In accordance with these and many other objects of the present invention, a shielding vent for shielded enclosures embodying the present invention includes a mounting plate or flange through which extends a relatively large diameter vent pipe with an internal septum plate or divider extending axially along at least a portion of the inner length of the vent pipe. The mounting flange is secured to a wall of the shielded enclosure over an opening in the wall. The mounting flange makes contact with a shielding layer on the wall in order to insure that the integrity of the shielding for the enclosure is maintained. With the mounting flange so mounted on the wall of the enclosure, the vent pipe extends through the opening in the wall of the enclosure so as to provide a vent for the enclosure. The septum plate has a cross section in the shape of a cross so that at least a portion of the length of the cylindrically shaped vent pipe is subdivided into four parallel, axially extending equal flow sections. These fluid flow sections are sufficiently large in cross sectional area that they provide a minimum of resistance to fluid flowing through the vent pipe and consequently, do not tend to freeze up as might be the case with the fluid flow sections in previously used honeycomb structures. By using the cross-shaped septum plate in the vent pipe, the vent pipe can be made significantly shorter in length than previously used vent pipes of similar diameter, yet the vent affords an adequate degree of EMI shielding.

BRIEF DESCRIPTION OF THE DRAWING

These and other objects and advantages of the present invention will become readily apparent upon consideration of the following detailed description of the embodiment of the invention shown in the accompanying drawings wherein:

FIG. 1 is a fragmentary perspective view of a portion of a shielded enclosure with a shielding vent embodying the present invention mounted through a wall of the enclosure;

FIG. 2 is a front view of the shielding vent illustrated in FIG. 1;

FIG. 3 is a side view of the shielding vent of FIG. 2;

FIG. 4 is a planar view of the septum that subdivides a portion of the shielding vent of FIG. 2; and FIG. 5 is a cross sectional view of the septum of FIG. 4 taken along line 5—5 in FIG. 4.

DETAILED DESCRIPTION OF THE PREFERRED EMBODIMENT

Referring now more specifically to FIG. 1 of the drawings, therein is disclosed a shielding vent generally designated by the reference numeral 10 and embodying the present invention. The shielding vent 10 includes a mounting flange or plate 12, a vent tube or pipe 14 and an internal septum or divider 16. The shielding vent 10 is shown in FIG. 1 as being mounted in a wall 18 of a shielded enclosure 20. The portion of the shielded enclosure 20 that is shown in FIG. 1 is shown for illustrative purposes and the wall 18 can be considered either a side wall or a ceiling of the shielded enclosure 20 because the vent 10 can be mounted in a side wall or the ceiling of the shielded enclosure 20. The shielded enclosure 20 may be any type of shielded enclosure having suitable support or frame members, walls, floor and ceiling panels and the like that is adapted to enclose a space or region entirely shielded from EMI interference from an external region. In order to provide the enclosure 20 with this shielding, the wall 18 can be covered with a layer of metal 21 such as a foil or sheet of copper. The shielding vent 10 is designed to provide a fluid (liquid or gas) communication path between the external and internal regions of the shielded enclosure 20, but nevertheless sufficiently attenuates any electromagnetic waves having a frequency below a cutoff frequency that might adversely affect the operation of diagnostic equipment or the like used within the enclosure 20.

The mounting plate 12 is a generally flat metal sheet of material with a central round hole 22 that is approximately the same diameter as the outer diameter of the vent pipe 14. The vent pipe 14 extends through the hole 22 and is secured to the mounting plate 12 by welding or the like. The mounting plate 12 has a series of mounting holes 24 through which fasteners 25 can be extended to affix the mounting plate 12 and thereby the shielding vent 10 to the wall 18 of the shielded enclosure 20. The mounting plate 12 covers any hole that is made in the wall 12 and is coupled to the layer 21. Hence, the mounting plate 12 maintains the integrity of the shielding for the shielded enclosure 20.

As is shown in the drawings, the vent pipe 14 is a metal pipe that has a cylindrical shape and that extends from a source end 26 to a receiving or protected end 28. The vent pipe 14 could have any other suitable cross sectional shape. For example, the vent pipe 14 could have a rectangular or square cross section. However, the circular cross section of the vent pipe 14 does tend to minimize any air turbulence that might develop as air flows through the vent pipe 14. As is discussed above, the diameter of the vent pipe 14 for certain applications might be approximately eight inches in diameter. Such a vent pipe 14 would provide a sufficient interior cross section fluid flow area to permit a large enough quantity of air to flow through the vent 14 in order to insure that any substantial build up of air pressure can be adequately vented in a short period of time. If the vent pipe 14 were eight inches in diameter and did not have the septum or divider 16, the vent pipe 14 might have to be as much as thirty two inches in length from its source end 26 to its protected end 28 in order to provide a desired amount of EMI protection to the shielded enclosure 20. However, the vent pipe 14 with a septum, such as the septum 16, disposed therein can be constructed as short as thirteen inches in length, or about 1.625 times greater than its diameter, and still provide a sufficient amount of attenuation of electromagnetic waves so that the shielding vent 10 can be used as a vent for the shielded enclosure 20.

The septum or divider 16 extends from the source end 26 toward the protected end 28 of the vent pipe 14. As can be seen in FIGS. 1, 2 and 4 of the drawings, the septum 16 has a cross section in the shape of a cross and therefore includes four vanes or legs 30, 32, 34 and 36 projecting or radiating from a central portion 38 of the septum 16. The outer extremities or radial edges of the vanes 30, 32, 34 and 36 are designed to fit tightly against an inner wall 39 of the vent pipe 14 and preferably are affixed to the inner wall 39. This affixing of the vanes 30, 32, 34 and 36 to an inner wall 39 can be accomplished by any suitable means, such as continuous welding or the like. In this regard, the performance of the vent 10 tends to become better as the conductive connection established between the inner wall 39 of the vent pipe 14 and the vanes 30, 32, 34 and 36 is improved.

When the septum 16 is disposed in the vent pipe 14, the vanes 30, 32, 34 and 36 extend from the source end 26 to a point 40 displaced from the protected end 28. The septum 16 effectively subdivides the portion of the vent pipe 14 extending from the source end 26 to the point 40 into four parallel, axially extending equal fluid flow sections 42, 44, 46 and 48 with the central portion 38 of the septum 16 extending along the central axis of the vent pipe 14. The fluid flow sections 42, 44, 46 and 48 are sufficiently large in cross sectional area so that each includes a substantial fractional portion of the cross sectional area of the vent pipe 14. Consequently, each of the fluid flow sections 42, 44, 46 and 48 provide a minimum of resistance to air flowing through the vent pipe 14. However, the vent 10 still affords an adequate degree of EMI shielding even though the length of the vent pipe 14 between the source end 26 and the protected end 28 can be significantly less than previously used shielded vent pipes.

In the embodiment disclosed in the drawings, the septum 16 extends from the source end 26 to the point 40 so that a substantial portion of length of the vent pipe 14 is subdivided into the flow sections 42, 44, 46 and 48. In the case where the vent pipe 14 is thirteen inches in length from the source end 26 to the protected end 28, the point 40 can be approximately ten inches from the source end 26 such that the septum 16 extends about three fourths of the distance from the source end 26 to the protected end 28. Alternatively, the point 40 can be at a point closer to the source end 26; the septum 16 can extend the full length of the vent pipe 14; or a pair of septums, like the septum 16, can be provided with each such septum extending from the ends 26 or 28 toward the center of the vent pipe 14. In any case, the vent pipe 14 nevertheless provides a sufficient amount of EMI shielding.

As illustrated more particularly in FIG. 5 of the drawings with respect to the vane 34, each of the vanes 30, 32, 34 and 36 of the septum 16 have outer beveled end surfaces 50 and 52. The end surfaces 50 and 52 are beveled so as to minimize any resistance to air flowing through the vent pipe 14 that is caused by the vanes 30, 32, 34 and 36, particularly when the vanes 30, 32, 34 and 36 are made from a thicker material.

As previously indicated, the mounting plate 12, the vent pipe 14 and the septum 16 can be made of any metal that is relatively conductive. Aluminum is one metal from which the mounting plate 12, the vent pipe 14 and the septum 16 can be made. Aluminum is a good conductor and at the same time is light in weight. Other metals such as copper or steel also can be used for making the mounting plate 12, the vent pipe 14 and the septum 16.

If aluminum is used as the material for the mounting plate 12, at least the portion of the mounting plate 12 that abuts against the layer 21 on the wall 18 of the enclosure 20 should be coated with a suitable covering or protective coating. One type of coating that can be used is an aluminum/bronze that can be applied by arc spraying. This type of coating minimizes the formation of any oxides on the outer surfaces of the aluminum mounting plate 12. If an oxide is formed, the integrity of the shielding for the enclosure 20 could be adversely affected because the oxide could insulate the mounting plate 12 from the layer of conductive material 21 on the wall 18 of the enclosure 20. An aluminum/bronze coating on the aluminum mounting plate 12 is particularly useful due to the fact that such a coating is more galvanically and electrically compatible with the layer 21 that is used as the shielding for the enclosure 20 than is aluminum.

If other materials are used for the mounting plate 12, tin or zinc may be used for the protective coating. The tin or zinc can be applied by any suitable process such as arc spraying or plating.

The preferred embodiment of the vent 10 disclosed in the drawings includes the mounting flange 12, the vent pipe 14 and the septum 16 as separate components that can be coupled together. It is possible that the vent 10 constructed in accordance with the present invention can be extruded so that the individual components are formed integrally. Alternatively, the vent 10 may include only the vent pipe 14 and the septum 16. In such a case, the vent pipe 14 would be directly connected to the shielding layer 21 of the shielded enclosure 20, for example, by welding or the like.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A vent for an electromagnetic interference shielded enclosure having a plurality of wall means with shielding means comprising:
   an elongated venting means extending through one of said wall means and being coupled to said shielding means, said venting means being in the form of an elongated cylinder;
   a mounting plate for securing said vent to one of said wall means and through which said venting means extends; and
   septum means disposed within said venting means along at least a portion of the length of said venting means subdividing at least a portion of said venting means into fluid flow sections that are substantial fractional portions of the cross section of the venting means.

2. A vent for an electromagnetic interference shielded enclosure as set forth in claim 1, wherein said mounting plate is made of aluminum with at least a portion of said mounting plate being coated with a protective coating.

3. A vent for an electromagnetic interference shielded enclosure as set forth in claim 2 wherein said protective coating is galvanically and electrically compatible with said shielding means.

4. A vent for an electromagnetic interference shielded enclosure having a plurality of wall means with shielding means comprising:
   an elongated venting means extending through one of said wall means and being coupled to said shielding means;
   septum means disposed within said venting means along at least a portion of the length of said venting means subdividing at least a portion of said venting means into fluid flow sections that are substantial fractional portions of the cross section of the venting means; and
   a mounting plate for securing said vent to one of said wall means and through which said venting means extends, said mounting plate is made of aluminum with at least a portion of said mounting plate being coated with a protective coating which is galvanically and electrically compatible with said shielding means and which is an aluminum/bronze that is arc sprayed onto said mounting plate.

5. A vent for an electromagnetic interference shielded enclosure as set forth in claim 1 wherein at least a portion of said mounting plate is coated with a protective coating.

6. A vent for an electromagnetic interference shielded enclosure having a plurality of wall means with shielding means comprising:
   an elongated venting means extending through one of said wall means and being coupled to said shielding means;
   septum means disposed within said venting means along at least a portion of the length of said venting means subdividing at least a portion of said venting means into fluid flow sections that are substantial fractional portions of the cross section of the venting means; and a mounting plate for securing said vent to one of said wall means and through which said venting means extends, at least a portion of said mounting plate is coated with a protective coating that is tin or zinc.

7. A vent for an electromagnetic interference shielded enclosure having a plurality of wall means with shielding means comprising:

an elongated venting means extending through one of said wall means and being coupled to said shielding means, said venting means being in the form of an elongated cylinder; and septum means disposed within said venting means along at least a portion of the length of said venting means subdividing at least a portion of the length of said venting means into four substantially equal fluid flow sections.

8. A vent for an electromagnetic interference shielded enclosure having a plurality of wall means with shielding means comprising:

an elongated venting means extending through one of said wall means and being coupled to said shielding means, said venting means being in the form of an elongated cylinder that has a substantially unrestricted fluid flow path between ends thereof; and septum means disposed within said venting means along at least a portion of the length of said venting means subdividing at least a portion of said venting means into fluid flow sections that are substantial fractional portions of the cross section of the venting means.

9. A vent for an electromagnetic interference shielded enclosure as set forth in claim 8 wherein the length of said elongated cylinder is about 1.625 times its diameter.

10. A vent for an electromagnetic interference shielded enclosure having a plurality of wall means with shielding means comprising:

an elongated venting means extending through one of said wall means and being coupled to said shielding means, said venting means being a vent pipe having an elongated axis and septum means disposed within said venting means along at least a portion of the length of said venting means subdividing at least a portion of said venting means into fluid flow sections that are substantial fractional portions of the cross section of the venting means, said septum means having vanes radiating from a central portion that is disposed along said elongated axis of said vent pipe.

11. A vent for an electromagnetic interference shielded enclosure as set forth in claim 10, wherein outer radial edges of said vanes are coupled to said vent pipe.

12. A vent for an electromagnetic interference shielded enclosure as set forth in claim 11 wherein said outer radial edges of said vanes are welded to said vent pipe.

13. A vent for an electromagnetic interference shielded enclosure having a plurality of wall means with shielding means comprising:

an elongated venting means extending through one of said wall means and being coupled to said shielding means, said venting means being in the form of an elongated cylinder; and septum means disposed within said venting means along at least a portion of the length of said venting means and is in the form of a cross so as to subdivide at least a portion of said venting means into four substantially equal, parallel extending fluid flow sections.

14. A vent for an electromagnetic interference shielded enclosure having a plurality of wall means with shielding means comprising:

an elongated venting means extending through one of said wall means and being coupled to said shielding means, said venting means being in the form of an elongated cylinder and extends from a source end to a protected end; and septum means disposed within said venting means along at least a portion of the length of said venting means subdividing at least a portion of said venting means into fluid flow sections that are substantial fractional portions of the cross section of the venting means, said septum means being disposed along a portion of said venting means between said source end and said protected end.

15. A vent for an electromagnetic interference shielded enclosure as set forth in claim 14 wherein said septum means extends from said source end to a point displaced from said protected end.

16. A vent for an electromagnetic interference shielded enclosure as set forth in claim 15 wherein said point is approximately three fourths of the distance from said source end to said protected end.

17. A vent for an electromagnetic interference shielded enclosure having a plurality of wall means with shielding means comprising:

an elongated venting means extending through one of said wall means and being coupled to said shielding means; and septum means disposed within said venting means along at least a portion of the length of said venting means subdividing at least a portion of said venting means into fluid flow sections that are substantial fractional portions of the cross section of the venting means, said septum means including a plurality of vanes projecting from a central portion that is located along the longitudinal axis of said venting means and which have beveled end surfaces.

18. A vent for an EMI shielded room having a wall means with a continuous electrically conductive wall shield providing an enclosed region shielded from an external region, said vent comprising:

a venting means projecting through said wall means from said external region into said enclosed shielded region for providing fluid communication between said enclosed region and said external region, said venting means being coupled to said wall shield; and dividing means disposed along at least a portion of the length of said venting means subdividing at least a portion of said venting means into fluid flow sections that are substantial fractional portions of the cross section of the venting means.

19. A vent for an EMI shielded room as set forth in claim 18 including a mounting flange for securing said vent to said wall means, said mounting flange being coupled to said electrically conductive wall shield.

20. A vent for an EMI shielded room having a wall means with a continuous electrically conductive wall shield providing an enclosed region shielded from an external region, said vent comprising:

a venting means projecting through said wall means from said external region into said enclosed shielded region for providing fluid communication between said enclosed region and said external region, said venting means being coupled to said wall shield and being a vent pipe having an elongated axis; and dividing means disposed along at least a portion of the length of said venting means subdividing at least a portion of said venting means into fluid flow sections that are substantial fractional portions of the cross section of the venting means, said dividing means having vanes radiating from a central portion that is disposed along said elongated axis of said vent pipe.

21. A vent for an EMI shielded room as set forth in claim 18 wherein said dividing means subdivides at least a portion of the length of said venting means into four substantially equal fluid flow sections.

22. A vent for an EMI shielded room having a wall means with a continuous electrically conductive wall shield providing an enclosed region shielded from an external region, said vent comprising:

a venting means protecting through said wall means from said external region into said enclosed shielded region for providing fluid communication between said enclosed region and said external region, said venting means being coupled to said wall shield; and dividing means disposed along at least a portion of the length of said venting means subdividing at least a portion of said venting means into fluid flow sections that are substantial fractional portions of the cross section of the venting means, said dividing means being in the form of a cross that subdivides at least a portion of said venting means into four substantially equal, parallel extending fluid flow sections.

23. An electromagnetic interference shielded enclosure comprising:

a plurality of walls with a continuous electrically conductive wall shield so as to provide an enclosed region shielded from an external region;

a venting means projecting through one of said walls from said external region into said enclosed shielded region for providing fluid communication between said enclosed region and said external region, said venting means being coupled to said wall shield and said venting means being a vent pipe having an elongated axis; and septum means disposed along at least a portion of the length of said venting means subdividing at least a portion of said venting means into fluid flow sections that are substantial fractional portions of the cross section of the venting means, said septum means having vanes radiating from a central portion that is disposed along said elongated axis of said vent pipe.

24. An electromagnetic shielded enclosure as set forth in claim 23 wherein said septum means subdivides at least a portion of the length of said venting means into four substantially equal fluid flow sections.

* * * * *